United States Patent [19]
Akamatsu et al.

[11] Patent Number: 5,699,300
[45] Date of Patent: Dec. 16, 1997

[54] DIVIDED WORDLINE MEMORY ARRANGEMENT HAVING OVERLAPPING ACTIVATION OF WORDLINES DURING CONTINUOUS ACCESS CYCLE

[76] Inventors: Hironori Akamatsu, 103, Todacho-5-chome, Moriguchi-shi; Tsuyoshi Shiragasawa, 9-16-605, Shimizucho, Neyagawa-shi; Junko Matsushima, 688-3, Kuzumotocho, Kashihara-shi; Hisakazu Kotani, 13-58-303, Kashio-2-chome, Takarazuka-shi, all of Japan

[21] Appl. No.: 341,947

[22] Filed: Nov. 16, 1994

Related U.S. Application Data

[63] Continuation of Ser. No. 12,800, Feb. 2, 1993, abandoned, which is a continuation of Ser. No. 523,425, May 15, 1990, abandoned.

[30] Foreign Application Priority Data

May 26, 1989 [JP] Japan .................................. 1-133443

[51] Int. Cl.⁶ .................................. G11C 7/00; G11C 8/00
[52] U.S. Cl. ............ 365/189.04; 365/193; 365/230.03; 365/233
[58] Field of Search ................ 365/189.02, 189.04, 365/230.03, 230.04, 233, 233.5, 193, 230.06; 307/600, 601, 602, 603

[56] References Cited

U.S. PATENT DOCUMENTS

| | | | |
|---|---|---|---|
| 4,542,486 | 9/1985 | Anami et al. | 365/230.03 |
| 4,707,809 | 11/1987 | Ando | 365/233.5 |
| 4,788,667 | 11/1988 | Nakano et al. | 365/238.5 |
| 4,800,530 | 1/1989 | Itoh et al. | 365/230.04 |
| 4,843,596 | 6/1989 | Miyatake et al. | 365/233.5 |
| 4,847,809 | 7/1989 | Suzuki | 365/230.04 |
| 4,849,937 | 7/1989 | Yoshimoto | 365/230.04 |
| 4,965,770 | 10/1990 | Yanagisawa | 365/230.03 |

FOREIGN PATENT DOCUMENTS

| | | |
|---|---|---|
| 60-157798A | 8/1985 | Japan . |
| 62-1182A | 1/1987 | Japan . |
| 63-244398A | 10/1988 | Japan . |

OTHER PUBLICATIONS

Ohta K. et al, A 1Mb DRAM with 33MHZ Serial I/O Ports, 1986 ISSCC Digest of Technical Papers. pp., 274–275.

VLSI Simposium by Electronics Information Communication Society on Jun. 2, 1989 "50MHZ 8Mbit Video Memory" by Kotani, et al., pp.105–106.

S. Ishimoto et al, SessionIII: Special Application Memories: A 256K Dual Port Memory; 1985 IEEE International Solid–State Circuits Conference; pp. 38–39.

*Primary Examiner*—Jack A. Lane

[57] ABSTRACT

A semiconductor memory device comprising memory cells arranged in a matrix with plural pairs of bit lines to be column addressed and connected to sense amplifiers, and word lines to be row addressed and divided into divisional word lines. Output signals of sense amplifiers selected by the column addressing are transferred to respective data lines. The divisional word lines are time-sequentially activated corresponding to the row addressing with the activated states of any two sequential divisional word lines overlapped for a fractional time of the full activation time. The sense amplifiers are grouped into plural groups with respective common column addresses. Each group of sense amplifiers have their outputs to be applied to respective data lines connected to a serial/parallel converter.

63 Claims, 11 Drawing Sheets

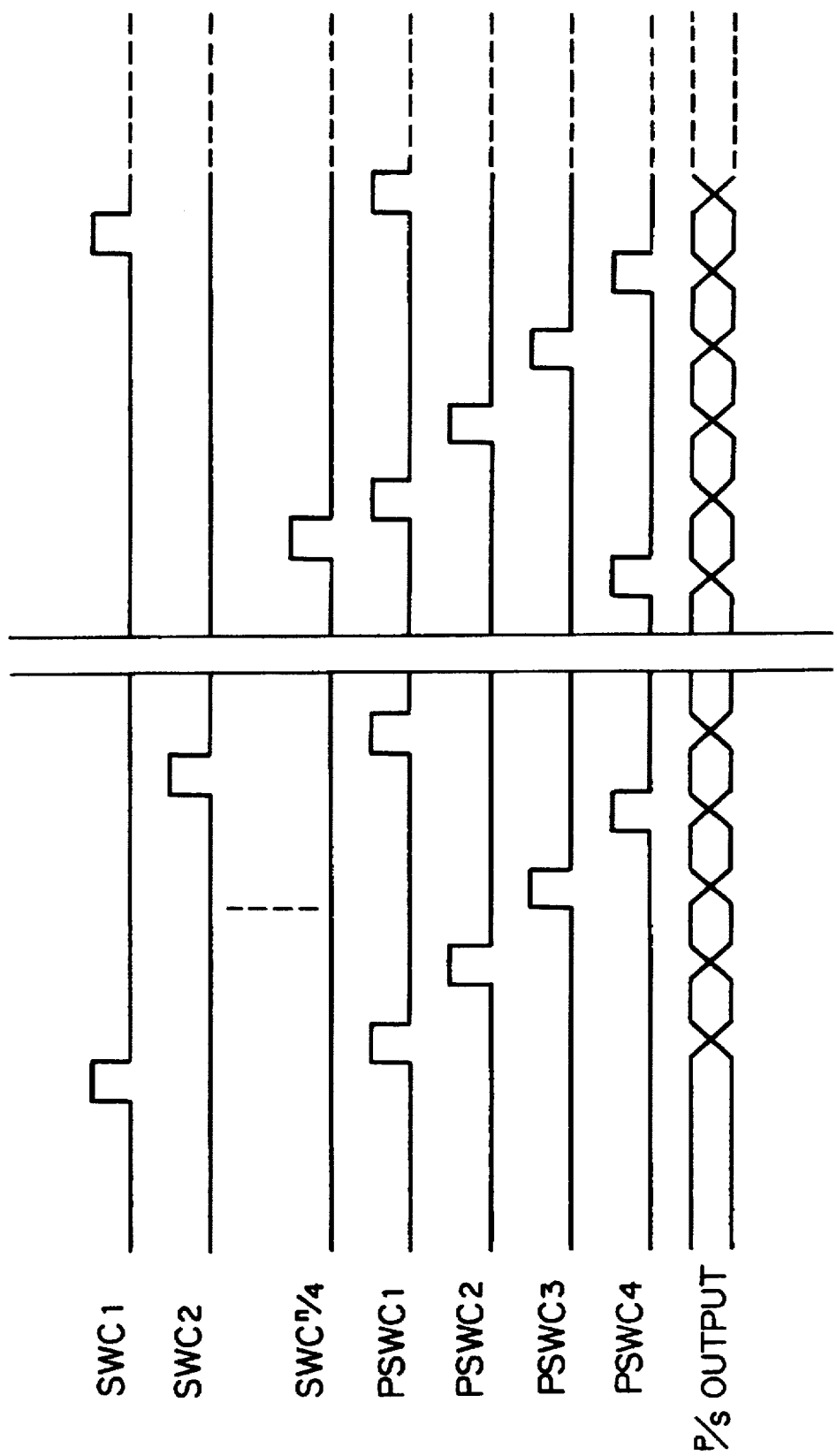

DIVIDED WORDLINE MEMORY ARRANGEMENT HAVING OVERLAPPING ACTIVATION OF WORDLINES DURING CONTINUOUS ACCESS CYCLE

This application is a continuation of application Ser. No. 08/012,800, filed Feb. 2, 1993 (abandoned) which is a continuation of Ser. No. 07/523,425, filed May 15, 1990 (abandoned).

BACKGROUND OF THE INVENTION

The present invention relates to a semiconductor memory device.

FIG. 1 shows the construction of a prior art semiconductor memory device. In FIG. 1, bit line pairs b1, $\overline{b1}$ to bn, $\overline{bn}$ are respectively connected to sense amplifiers SA1 to SAn. When one of a plurality of word lines, for example, a word line W1 is selected to assume a high level, data in memory cells MC's selected by the word line W1 are read onto the bit lines b1 to bn. Subsequently, a sense amplifier power supply control circuit PLC activates a power supply line VL and a ground line GL provided for the sense amplifiers SA1 to SAn so that the sense amplifiers SA1 to SAn initiate sensing operation. Data stored in the selected memory cells are amplified sufficiently by these sense amplifiers and then transferred to latch circuits LAT1 to LATn, and thereafter control lines SWC1 to SWCn for switch elements SW1, $\overline{SW1}$ to SWn, $\overline{SWn}$ are sequentially selected by means of a column decoder CO to assume a high level so that the data may be transferred to a pair of data lines D and $\overline{D}$. The storage data now transferred to the data line pair D and $\overline{D}$ are further amplified by main amplifiers and then transferred to an output circuit from which the data are read sequentially. The semiconductor memory device having the construction described above is disclosed in "A 256K Dual Port Memory" by S. Ishimoto et al, ISSCC Digest of Technical Papers, 1985, pp. 38–39. Operation timings in the semiconductor memory device shown in FIG. 1 are illustrated in FIG. 2. As shown in FIG. 1, data amplified by the sense amplifiers SA1 to SAn are latched by the latch circuits LA1 to LAn, thus allowing the sense amplifiers SA1 to SAn to end read operation of the data and to make ready for the next read operation, and therefore incessant data transfer can be insured.

However, the number of the sense amplifiers SA1 to SAn is so large that the value of n amounts approximately up to 1K to 4K and disadvantageously, when the data are transferred to the latch circuits LAT1 to LATn at a time, transient current occurring during the transfer becomes excessively large. To cope with this problem, another prior art semiconductor memory device as shown in FIG. 3 has been proposed wherein the data line pair D, $\overline{D}$ is divided into four data line pairs which connect to a parallel/serial converter circuit P/S. The sense amplifiers SA1 to SAn are sorted into four groups and data amplified in each group are transferred to data line pairs D1, $\overline{D1}$ to D4, $\overline{D4}$ and sent to the parallel/serial converter circuit. The semiconductor memory device having the above construction is disclosed in "A 1 Mb DRAM with 33 MHz Serial I/O Ports" by K. Ohta et al, ISSCC Digest of Technical Papers, 1986, pp. 274–275. After being subjected to parallel/serial conversion, the data are sent to the output circuit and delivered therefrom. FIG. 4 illustrates a construction of the parallel/serial converter circuit shown in FIG. 3. Referring to FIG. 4, data transferred to the data lines D1, $\overline{D1}$ to D4, $\overline{D4}$ are amplified in main amplifiers MA1 to MA4. Subsequently, a signal on a latch circuit control line LAC is rendered to be high level so that the data are latched by latch circuits LA1 to LAn and thereafter transferred sequentially to the output circuit through switch elements PSW1 to PSW4. Operation timings in this semiconductor memory device are illustrated in FIG. 5. As will be seen from FIG. 5, data are delivered incessantly and because of the number of circuits to be operated being small, transient current during the data transfer can be suppressed. However, an interval of time between the falling of a word line following read out of data associated with this word line and the rising of the succeeding word line is so small that as the data read speed increases, incessant delivery of data becomes difficult to achieve.

As described above, the prior art semiconductor memory devices have disadvantages that when stored data are sequentially and incessantly read out, transient current during operation is excessively large and besides the incessant delivery of data becomes difficult to achieve as the data read speed increases. With the existing construction, semiconductor memory devices of satisfactorily high performance can not be obtained.

SUMMARY OF THE INVENTION

The present invention has been implemented with the foregoing backgrounds and an object of this invention is to provide a semiconductor memory device capable of reading and writing data incessantly at high rates while suppressing transient currents during operation.

To accomplish the above object, according to one aspect of the present invention a semiconductor memory device comprises a memory array unit in which memory cells are arranged in matrix, and sense amplifiers arranged exteriorly of the memory array unit wherein in the memory array unit, a plurality of bit line pairs are disposed to be selected by column addresses and a plurality of word lines are disposed to be selected by row addresses, each of the plurality of word lines being divided into a plurality of divisional word lines, the plurality of bit line pairs are connected to the respective sense amplifiers, output signals of sense amplifiers corresponding to the column address selection are transferred to respective data lines, the divisional word lines are sequentially activated on time division basis in correspondence to the row address selection such that the activation of one of any two sequential divisional word lines overlaps with the activation of the other for a predetermined time.

According to an embodiment, another aspect of the present invention, the plurality of sense amplifiers are sorted into a plurality of groups, respective sense amplifiers in each group have a common column address and each sense amplifier transfers output signals to a respective different data line pair when the common column address is selected, and the plurality of data line pairs are connected to a serial/parallel converter circuit and/or a parallel/serial converter circuit.

With the above construction, the number of circuits to be operated at a time can be reduced and data can be inputted and outputted regardless of timings of the rise and fall of word line signals and consequently, the semiconductor memory device according to the present invention can perform incessant data input/output operations at high rates while suppressing transient currents during operation. Further, in accordance with the aforementioned construction, the number of circuits, which can be operated simultaneously, can be increased within a range of permissible transient current, thereby further increasing the data input/output speed.

BRIEF DESCRIPTION OF THE DRAWINGS

FIG. 11 is a timing chart showing the operation of the FIG. 10 semiconductor memory device.

DESCRIPTION OF THE PREFERRED EMBODIMENTS (Embodiment 1)

Figure 6:
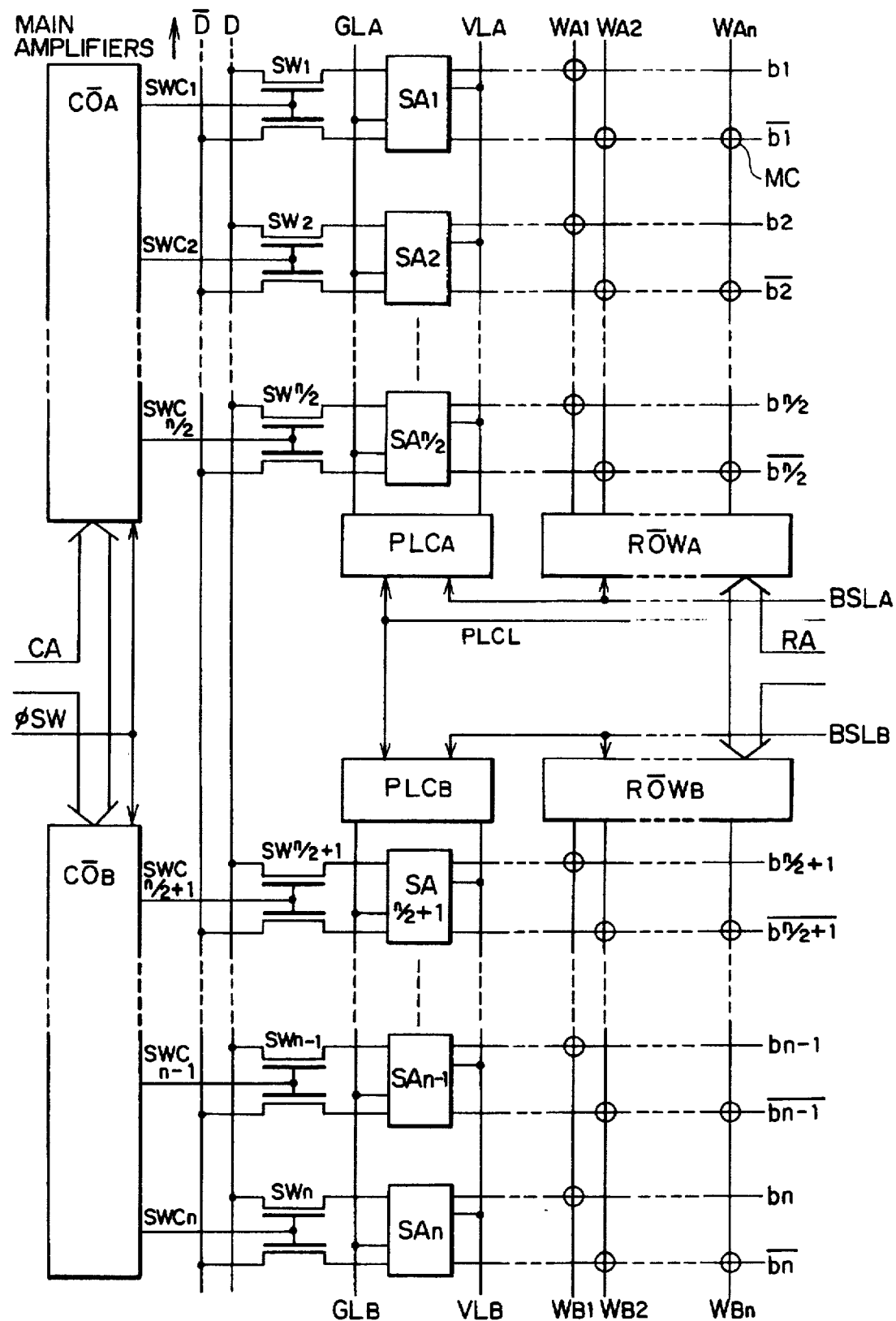
FIG. 6 is a circuit diagram schematically showing the construction of a semiconductor memory device according to a first embodiment of the invention.
Figure 7:
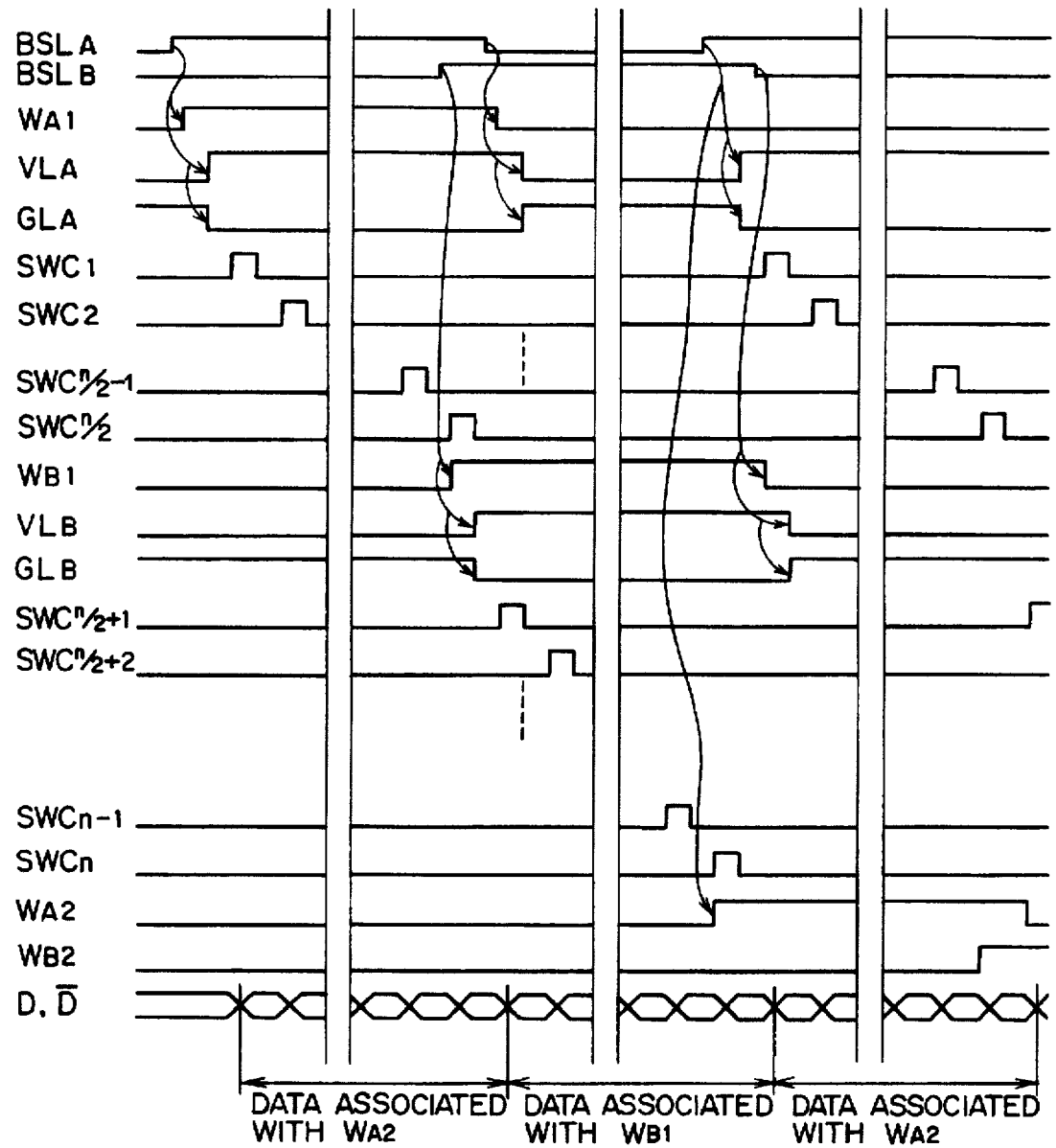
FIG. 7 is a timing chart showing the operation of the FIG. 6 semiconductor memory device.

An embodiment of a semiconductor memory device according to the invention will now be described with reference to FIGS. 6 and 7. FIG. 6 shows the construction of a semiconductor memory device according to a first embodiment of the invention. In FIG. 6, bit line pairs b1, $\overline{b1}$ to bn, $\overline{bn}$ are respectively connected to sense amplifiers SA1 to SAn, and complementary outputs of the individual sense amplifiers SA1 to SAn are connected, through switch elements SW1 to SWn, to data lines D and $\overline{D}$ connected to main amplifiers. The switch elements SW1 to SWn are open/close controlled by signals delivered from column decoders $CO_A$ and $CO_B$ to switch element open/close control signal lines SWC1 to SWCn. The sense amplifiers SA1 to SAn are sorted into two groups, of which one includes sense amplifiers SA1 to SAn/2 and the other includes sense amplifiers SAn/2+1 to SAn, and similarly the bit lines, switch elements and switch open/close control signal lines are sorted into the above two groups. The former group is defined as A block and the latter group as B block. A sense amplifier power supply control circuit PLC, a row decoder ROW and a column decoder CO comprised in one group are independent of those comprised in the other group. In addition, word lines W are also sorted into the two groups so that each of the word lines is divided into two divisional word lines. With the above construction, time difference is set between activation of word lines in one group and that of word lines in the other group and the sense amplifier power supply control circuits PLC's are operated in compliance with the activation of the word lines of the respective groups, thus making it possible to produce data outputs incessantly.

More specifically, in accordance with the present embodiment, block selection signals $BSL_A$ and $BSL_B$ have a time difference therebetween and control the sense amplifier power supply control circuits PLC's and row decoders ROW's in the respective blocks.

Figure 8:
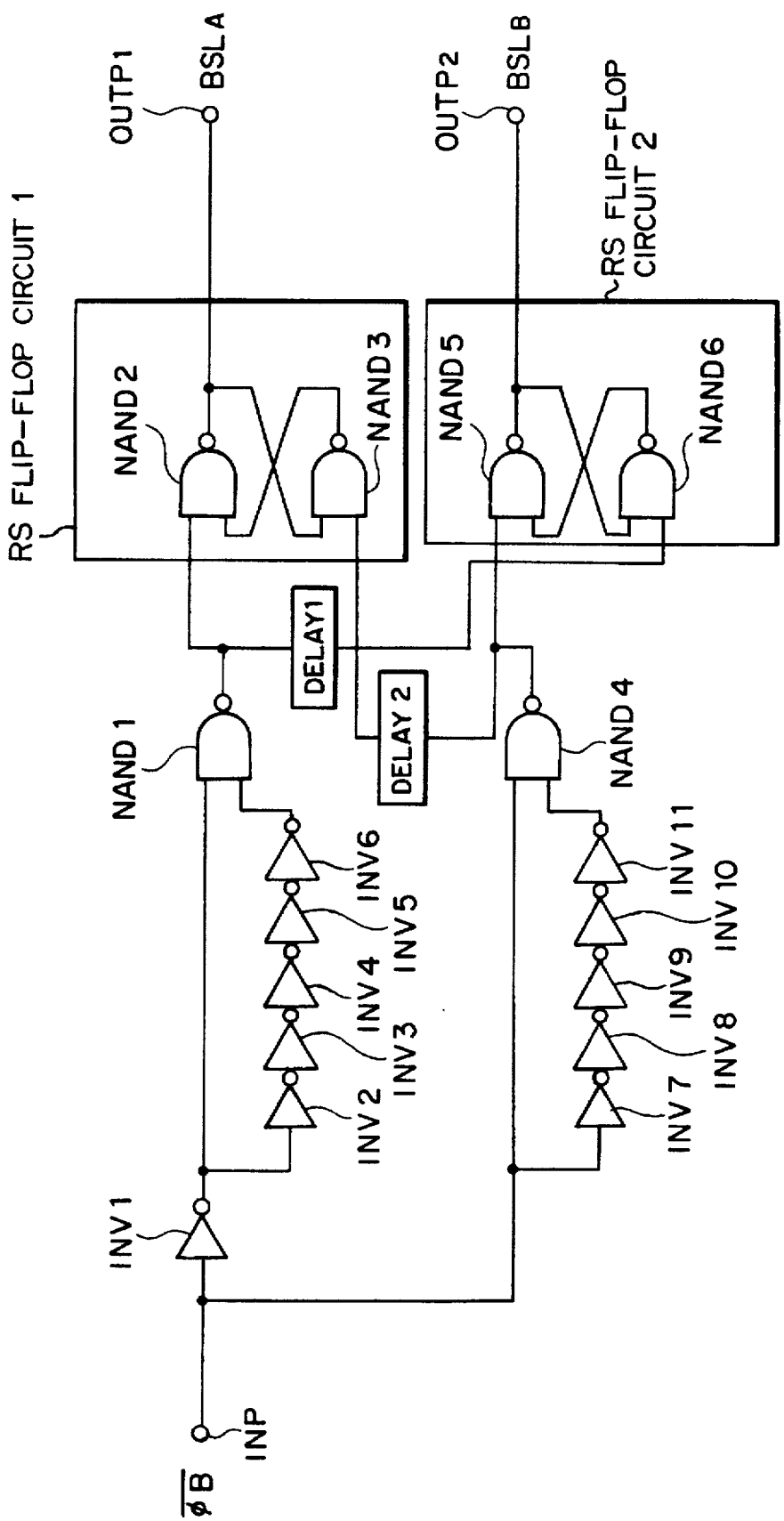
FIG. 8 is a circuit diagram of a circuit for generating control signals $BSL_A$ and $BSL_B$ shown in FIGS. 6 and 7.
Figure 9:
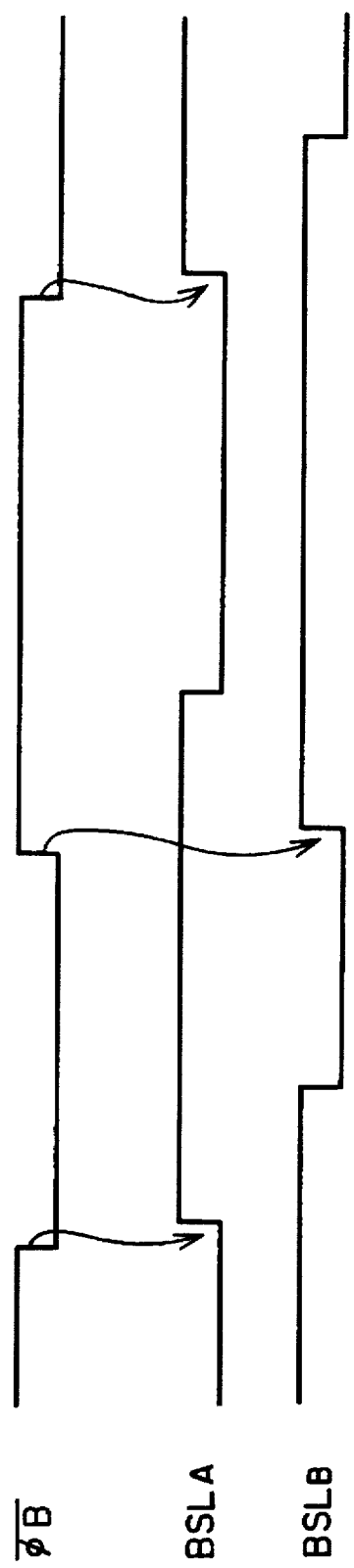
FIG. 9 is a timing chart showing the operation of the FIG. 8 circuit.

An embodiment of a circuit adapted to generate the block selection signals $BSL_A$ and $BSL_B$ is illustrated in FIG. 8. Referring to FIG. 8, an input signal $\overline{\phi B}$ is supplied from an input terminal INP and fall of the input signal is detected by a fall edge detector circuit comprised of inverters INV1 to INV6 and a NAND circuit NAND1 to provide a set signal for an RS flip-flop circuit 1 comprised of NAND circuits NAND2 and NAND3, which flip-flop circuit 1 is set by the set signal to produce at output terminal OUTP1 the output signal $BSL_A$ which is at high level. Similarly, the rise of the input signal $\overline{\phi B}$ is detected by a rise edge detector circuit comprised of inverters INV7 to INV11 and a NAND circuit NAND4 to provide a set signal for an RS flip-flop circuit 2 comprised of NAND circuits NAND5 and NAND6, which flip-flop circuit is set by the set signal to produce at output terminal OUTP2 the output signal $BSL_B$ which is at high level. An output signal of the rise edge detector circuit is delayed by a predetermined time through a delay element DELAY2 and then applied as a reset signal to the RS flip-flop circuit 1 to make the output signal $BSL_A$ low level. Similarly, an output signal of the fall edge detector circuit is delayed by a predetermined time through a delay element DELAY1 and then applied as a reset signal to the RS flip-flop circuit 2 to make the output signal $BSL_B$ low level. The above-described relation between the input signal $\phi B$ and each of the output signals $BSL_A$ and $BSL_B$ is depicted in FIG. 9. With the semiconductor memory device shown in FIG. 6, data are read sequentially in accordance with operation timings as shown in FIG. 7. The operation timings will now be described. Firstly, a word line WA1 in the block A controlled by the block selection signal $BSL_A$ is raised to read data stored in memory cells MC's onto the bit line pairs b1, $\overline{b1}$ to bn/2, $\overline{bn}/2$. Subsequently, the sense amplifier power supply control circuit $PLC_A$ is operated to maintain a sense amplifier power supply line $VL_A$ at high level and a sense amplifier ground line $GL_A$ at low level, activating the sense amplifiers to cause them to sense and amplify the data. The thus sensed and amplified data are sequentially transferred to the data lines D and $\overline{D}$ through the switch elements SW1 to SWn/2 and then sent to the main amplifiers. In accordance with the present embodiment, before all data associated with the word line WA1 have been read out, a word line WB1 in the block B controlled by the block selection signal $BSL_B$ is raised to activate the sense amplifiers SAn/2+1 to SAn in anticipation of permitting data associated with the word line WB1 to be transferred any time to the data lines D and $\overline{D}$. Thus, as soon as the data associated with the word line WA1 have all been read out, reading of the data associated with the word line WB1 is initiated. Thereafter, a word line WA2 is raised while the data associated with the word line WB1 are read out and in this manner the ensuing word lines are sequentially raised, thereby ensuing that the delivery of data can be achieved incessantly regardless of the rising and falling of word line and the time for sensing and amplifying data and besides the magnitude of transient current during operation can be suppressed. By using part of the row address as the block selection signals $BSL_A$ and $BSL_B$, these block selection signals need not be generated internally and internal control can be facilitated. The present embodiment has been described by way of data read operation, but by transferring input data to the data lines D and $\overline{D}$, data can be written in a similar manner.

(EMBODIMENT 2)

Figure 1:
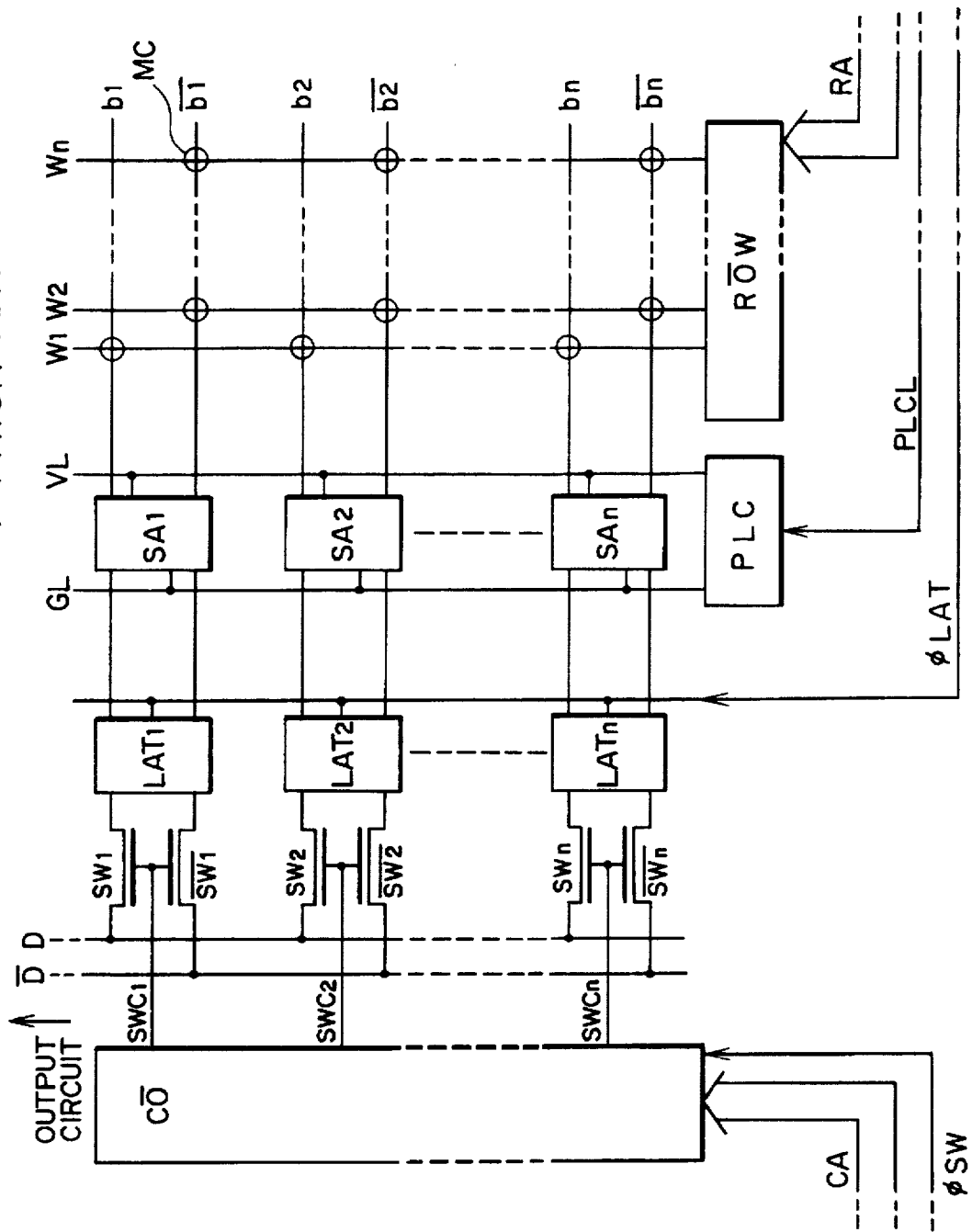
FIG. 1 is a circuit diagram schematically showing the construction of a prior art semiconductor memory device wherein latch circuits are connected between sense amplifiers and switch elements.
Figure 2:
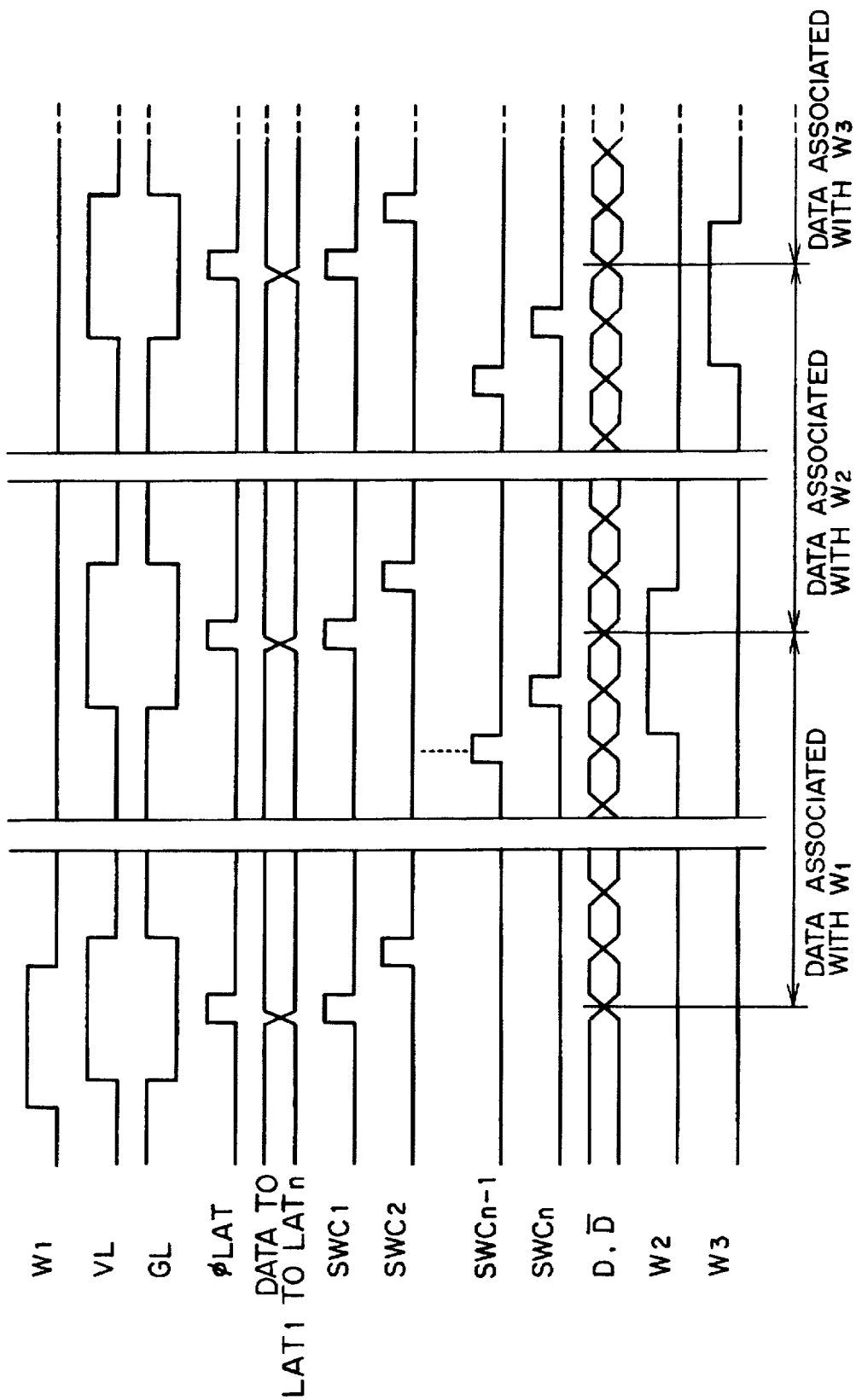
FIG. 2 is a timing chart showing the operation of the prior art FIG. 1 semiconductor memory device.
Figure 3:
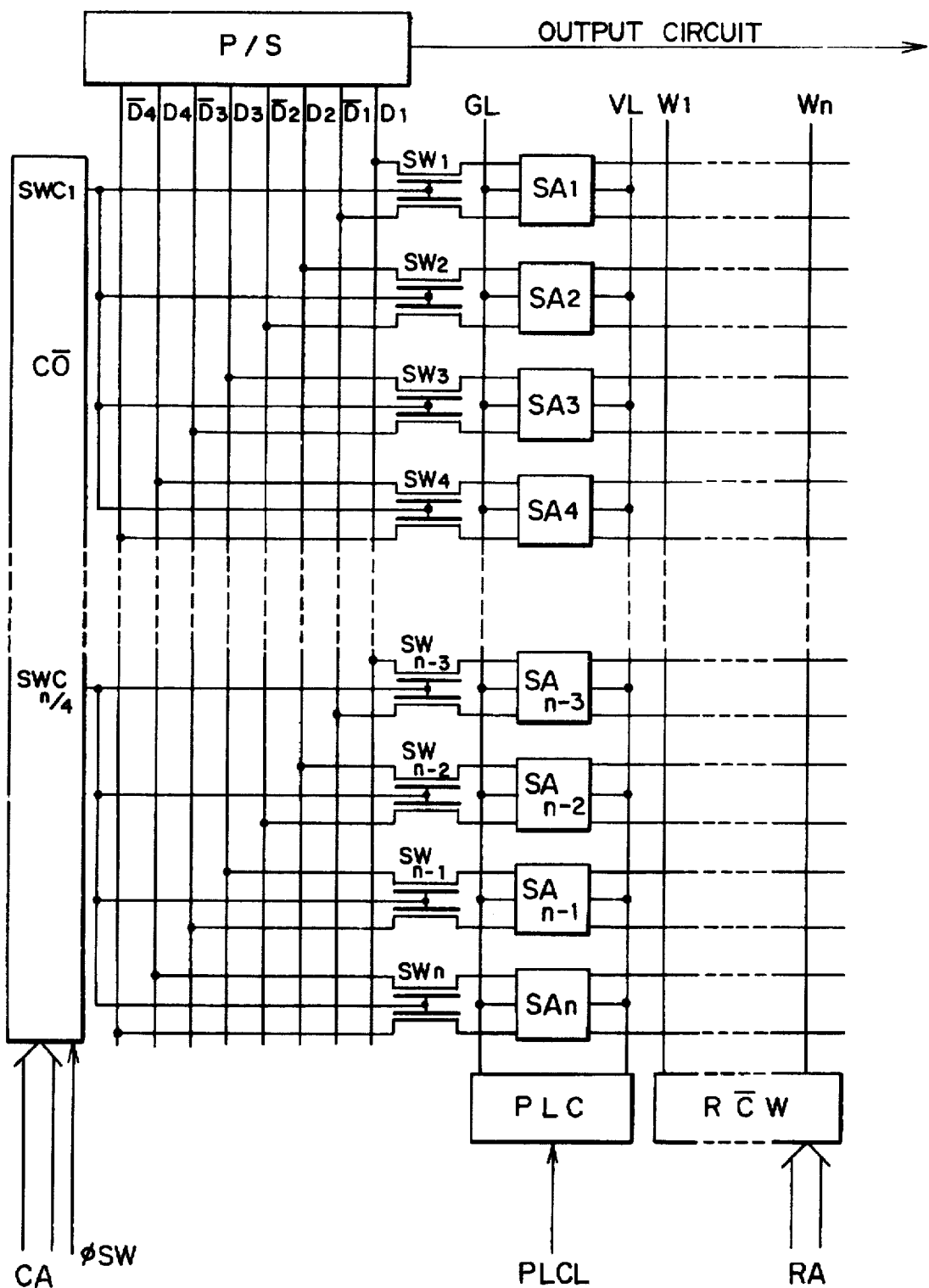
FIG. 3 is a circuit diagram schematically showing the construction of another prior art semiconductor memory device wherein a data line pair is divided into four pairs and a parallel/serial converter circuit is provided.
Figure 4:
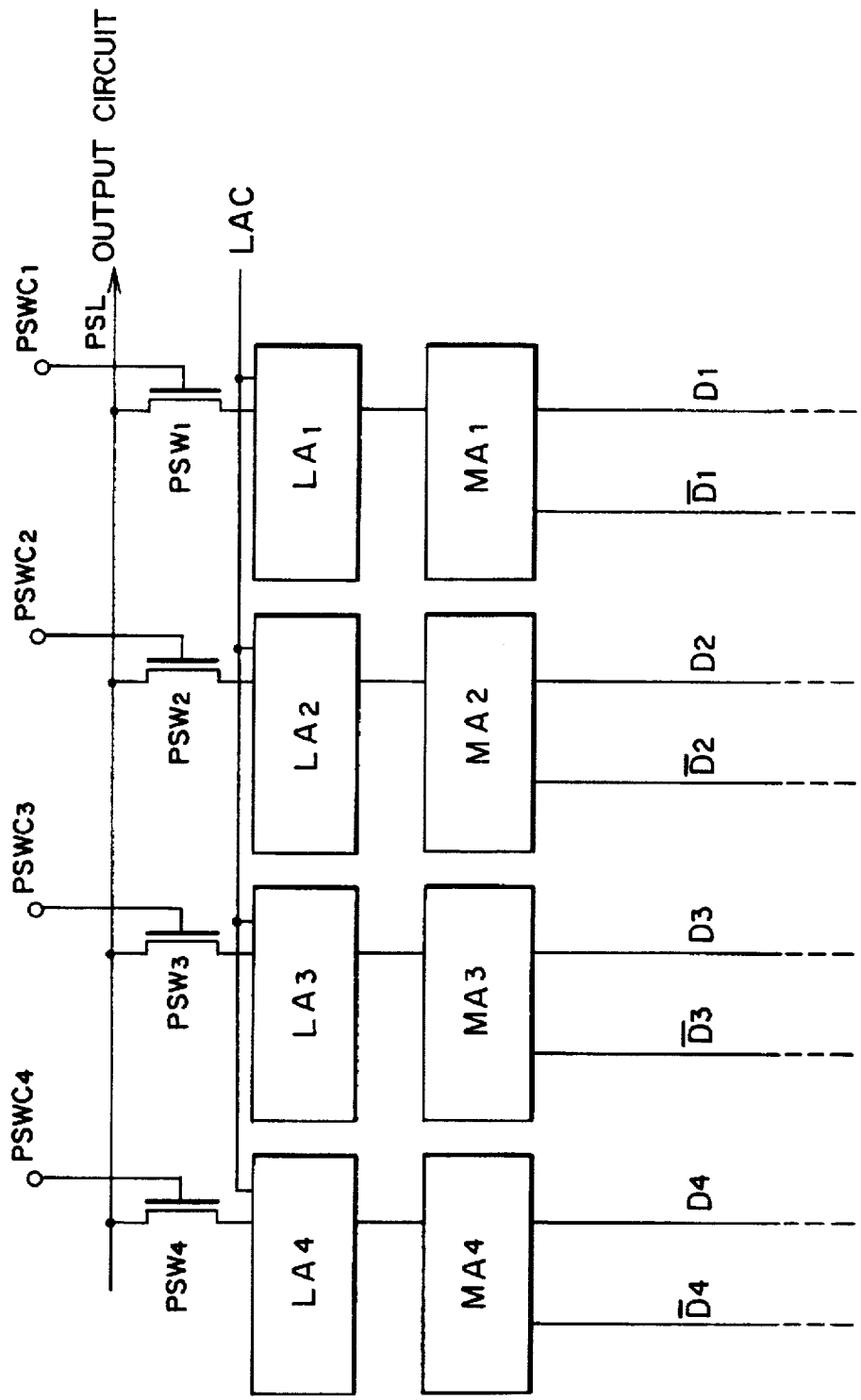
FIG. 4 is a circuit diagram showing an example of the construction of the prior art parallel/serial converter circuit.
Figure 5:
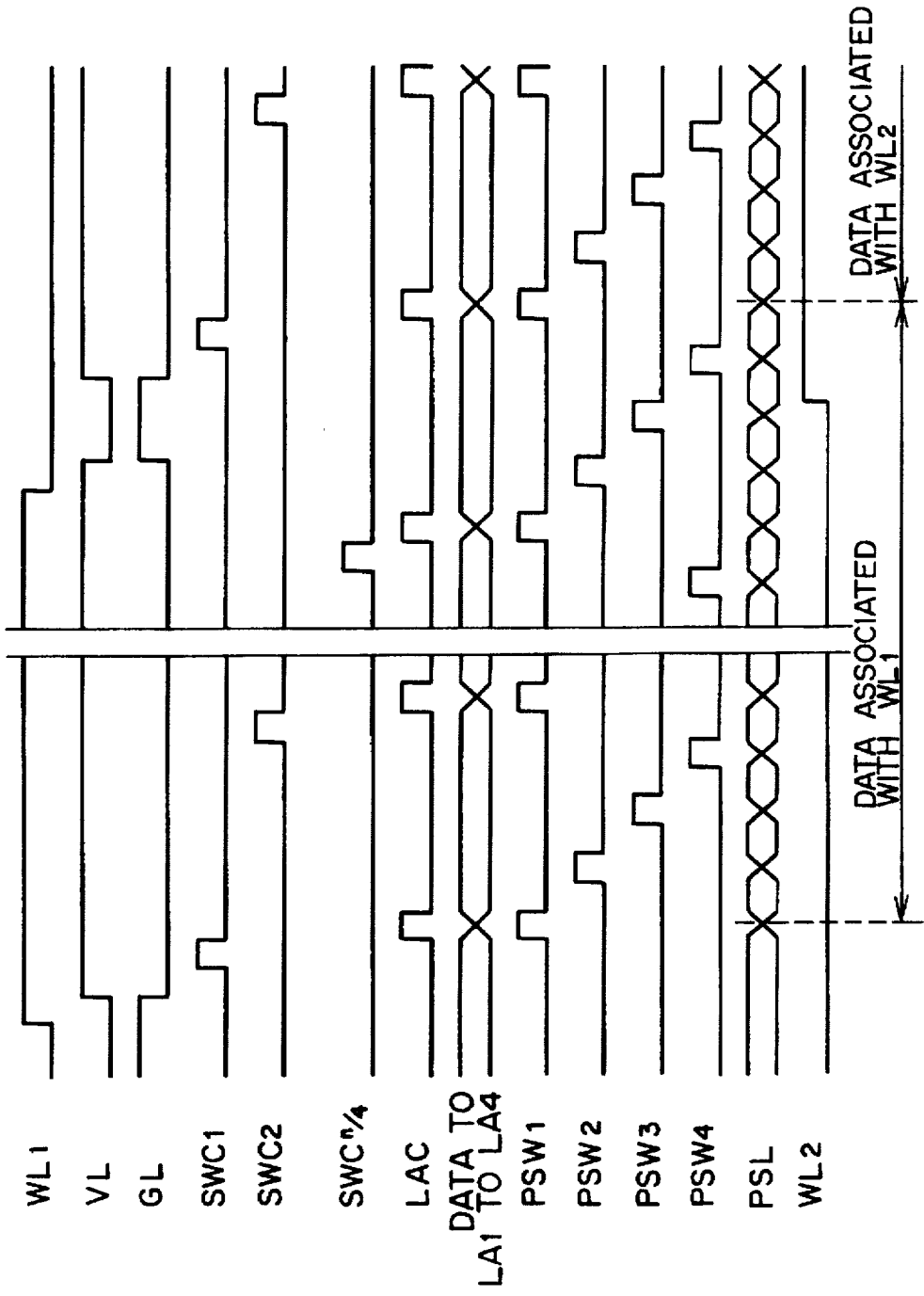
FIG. 5 is a timing chart showing the operation of the prior art FIG. 3 semiconductor memory device.
Figure 10:
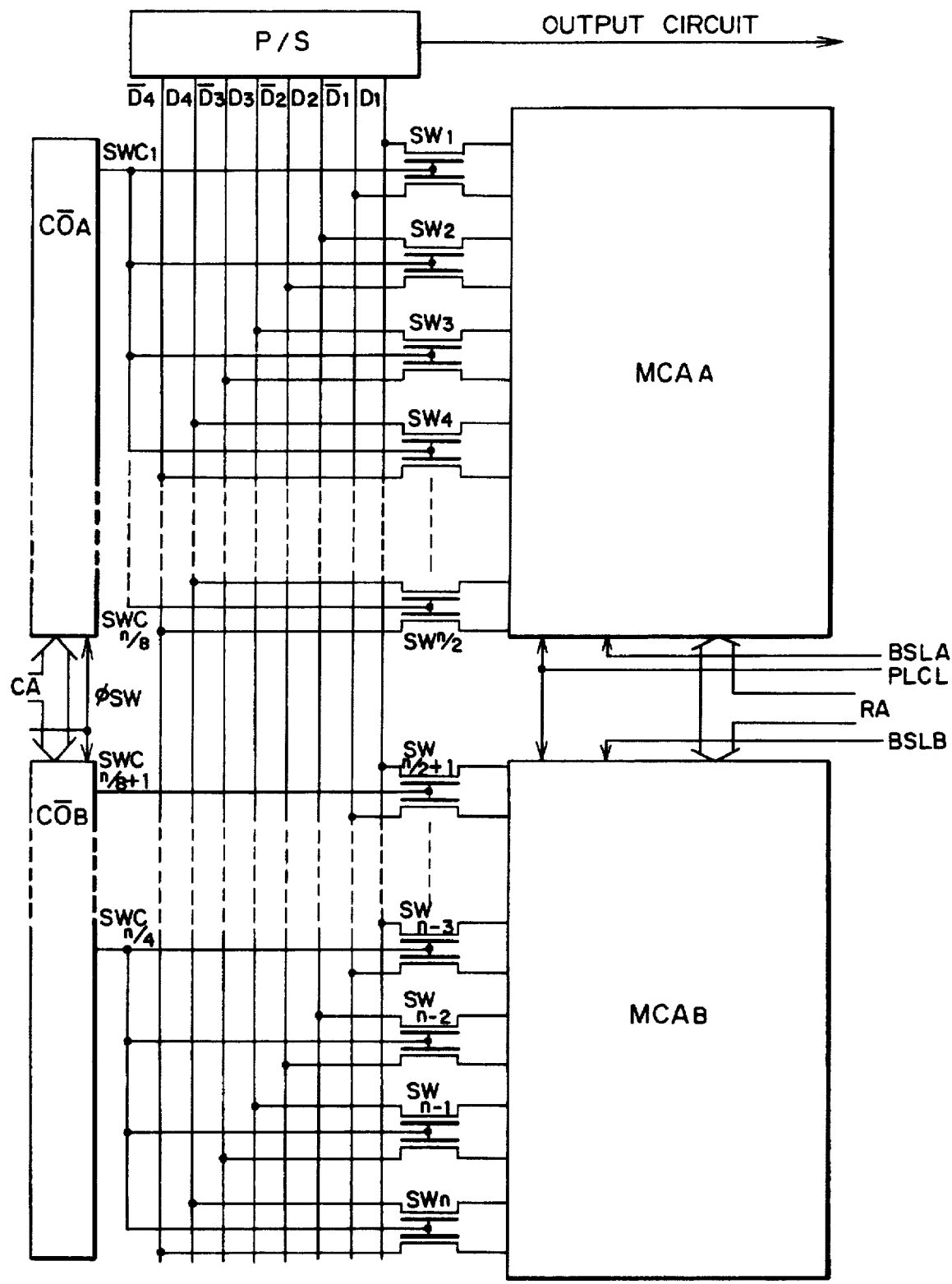
FIG. 10 is a circuit diagram schematically showing the construction of a semiconductor memory device according to a second embodiment of the invention wherein a data line pair in the FIG. 6 semiconductor memory device are divided into four pairs and a parallel/serial converter circuit is provided.

The semiconductor memory device shown in FIG. 6 can afford to deliver data incessantly but the data lines D and $\overline{D}$ have a large capacity and this makes it difficult to transfer data at a sufficiently high rate. In a second embodiment of the semiconductor memory device according to the invention as shown in FIG. 10, the data line pair in the semiconductor memory device shown in FIG. 6 are divided into four data line pairs with the view of increasing the transfer rate and these four data line pairs are connected to a parallel/serial converter circuit. In the FIG. 10 semiconductor memory device, D1, $\overline{D1}$ to D4, $\overline{D4}$ designate data line pairs and $MCA_A$ and $MCA_B$ designate memory cell arrays which are constructed of the same sense amplifiers, word lines, memory cells, row decoders and sense amplifier power supply control circuits as those in FIG. 6 and operate as in the case of the semiconductor memory device shown in FIG. 6. In this embodiment, the circuit shown in FIG. 8 may also be used to generate the block selection signals $BSL_A$ and $BSL_B$. The parallel/serial converter circuit P/S operates in the same way as the one shown in FIG. 3 and may be realized with the same circuit as that shown in FIG. 4. To describe the operation of the parallel/serial converter circuit shown in FIG. 4, data sent from data lines D1, $\overline{D1}$ to D4, $\overline{D4}$ are amplified in main amplifiers MA1 to MA4 and then transferred to latch circuits LA1 to LA4. These latch circuits LA's are controlled by a signal on signal line LAC so that the latch circuits LA1 to LA4 latch the data at a time. Subsequently, transfer gates PSW1 to PSW4 are sequentially turned on, beginning with the transfer gate PSW1, to sequentially supply the data to an output circuit. The above operation is repeated to complete parallel/serial conversion. Operation timings covering the switch elements SW1 to SWn and the parallel/serial converter circuit are illustrated in FIG. 11. As is clear from FIG. 11, the data can be delivered out of the parallel/serial conversion circuit at a rate which is four times as large as the rate of occurrence of the control signals SWC1 to SWCn for the switch elements SW1 to SWn. In accordance with this embodiment, the speed-up feature is achieved by the provision of the parallel/serial converter circuit but the number of simultaneously operated circuits is sufficiently small to suppress transient current during operation. By taking the construction described previously, incessant delivery of data at a high rate can be ensured while suppressing the transient currents during operation and besides the speed-up can be promoted by subjecting data sent from an increased number of divided data lines to parallel/serial conversion. Thus, the number of divisions of the data line pairs may be determined so as to be optimized for the data delivery rate and the magnitude of transient current during operation. The second embodiment has also been described by way of reading of data but by adding a serial/parallel converter circuit for inverse operation to that of the parallel/serial converter circuit, a write operation can be performed incessantly at a high rate as in the case of the read operation. Preferably, in order to permit high-rate and incessant performance in both the read and write operations, both of the parallel/serial converter circuit and serial/parallel converter circuit may be employed.

As is clear from the foregoing description, the semiconductor memory device according to the present invention can afford to perform high-rate and incessant data input/output operation while suppressing the transient current during operation and therefore can be designed easily, with less labor and time, for a large capacity semiconductor memory device especially used for realization of image memories.

We claim:

1. A semiconductor circuit comprising:

means for generating a first output signal and for detecting (i) a fall edge of an input signal to render said first output signal high level and (ii) a rise edge of said input signal to render said first output signal low level at expiration of a time delay equal to a first predetermined time period following detection of said rise edge; and means for generating a second output signal and for detecting (i) said rise edge of said input signal to render said second output signal high level and (ii) said fall edge of said input signal to render said second output signal low level at expiration of a time delay equal to a second predetermined time period following detection of said fall edge.

2. A semiconductor memory device comprising:

a memory array unit including memory cells arranged in matrix;

sense amplifiers arranged exteriorly of said memory array unit, wherein in said memory array unit, a plurality of bit line pairs are selected by column addresses and a plurality of word lines are selected by row addresses, each of said plurality of word lines being divided into a plurality of divided word lines, said plurality of bit line pairs are respectively connected to said sense amplifiers, output signals of ones of said sense amplifiers corresponding to column address selection are transferred to respective data lines, said divided word lines are sequentially activated on a time division basis in correspondence to row address selection such that an activation time period of one of any two sequentially activated divided word lines overlaps with an activation time period of the other of said two sequentially activated divided word lines for a first predetermined time period; and a semiconductor circuit including means for generating a first output signal and for detecting (i) a fall edge of an input signal to render said first output signal high level and (ii) a rise edge of said input signal to render said first output signal low level at expiration of a time delay equal to a second predetermined time period following detection of said rise edge; and means for generating a second output signal and for detecting (i) said rise edge of said input signal to render said second output signal high level and (ii) said fall edge of said input signal to render said second output signal low level at expiration of a time delay equal to a third predetermined time period following detection of said fall edge, said semiconductor circuit being used as a source for generating control signals comprising said first output signal and said second output signal, by means of which control signals said divided word lines are sequentially activated on said time division basis in correspondence to row address selection such that activated states of any two sequentially activated divided word lines overlap with each other for a time equal to said first predetermined time period.

3. A semiconductor memory device comprising:

a memory array unit including memory cells arranged in matrix;

sense amplifiers arranged exteriorly of said memory array unit, wherein in said memory array unit, a plurality of bit line pairs are selected by column addresses and a plurality of word lines are selected by row addresses, each of said plurality of word lines being divided into a plurality of divided word lines, said plurality of bit line pairs are respectively connected to said sense amplifiers, output signals of ones of said sense amplifiers corresponding to column address selection are transferred to respective data lines, said divided word lines are sequentially activated on a time division basis in correspondence to row address selection such that an activation time period of one of any two sequentially activated divided word lines overlaps with an activation time period of the other of said two sequentially activated divided word lines for a first predetermined time period; and wherein said plurality of sense amplifiers are sorted into a plurality of groups, sense amplifiers in each group have a common column address and transfer output signals to respective data line pairs when said common column address is selected, and a plurality of data line pairs are connected to a parallel/serial converter; and a semiconductor circuit including means for generating a first output signal and for detecting (i) a fall edge of an input signal to render said first output signal high level and (ii) a rise edge of said input signal to render said first output signal low level at expiration of a time delay equal to a second predetermined time period following detection of said rise edge; and means for generating a second output signal and for detecting (i) said rise edge of said input signal to render said second output signal high level and (ii) said fall edge of said input signal to render said second output signal low level at expiration of a time delay equal to a third predetermined time period following detection of said fall edge, said semiconductor circuit being used as a source for generating control signals comprising said first output signal and said second output signal, by means of which control signals said divided word lines are sequentially activated on said time division basis in correspondence to row address selection such that activated states of any two sequentially activated word lines overlap with each other for a time equal to said first predetermined time period.

4. A semiconductor memory device comprising:

a memory array unit including memory cells arranged in a matrix; and sense amplifiers arranged exteriorly of said memory array unit, wherein in said memory array unit, a plurality of bit line pairs are selected by column addresses and a plurality of word lines are selected by row addresses each of said plurality of word lines being divided into a plurality of divided word lines, said plurality of bit line pairs are respectively connected to said sense amplifiers, output signals of ones of said sense amplifiers corresponding to column address selection are transferred to respective data lines, said divided word lines are sequentially activated on a time division basis in correspondence to row address selection such that an activation time period of a middle one of any three sequentially activated divided word lines partially overlaps with respective activation time periods of the preceding one and successive one of aid any three sequentially activated divided word lines for a first predetermined period of time, wherein more than half of said activation period of said middle one of said word lines is non-overlapping with the activation periods of said preceding one and said successive one of the word line; and a semiconductor circuit including means for generating a first output signal and for detecting (i) a fall edge of an input signal to render said first output signal high level and (ii) a rise edge of said input signal to render said first output signal low level at expiration of a time delay equal to a second predetermined time period following detection of said rise edge; and means for generating a second output signal and for detecting (i) said rise edge of said input signal to render said second output signal high level and (ii) said fall edge of said input signal to render said second output signal low level at expiration of a time delay equal to a third predetermined time period following detection of said fall edge, said semiconductor circuit being used as a source for generating control signals comprising said first output signal and said second output signal, by means of which control signals said divided word lines are sequentially activated on said time division basis in correspondence to row address selection such that an activation time period of a middle one of any three sequentially activated divided word lines overlaps with respective activation time periods of the preceding one and the successive one of said three sequentially activated divided word lines for a time equal to said first predetermined time period.

5. A device according to claim 4, wherein more than half of said activation period of said middle one of said word lines is non-overlapping with the activation periods of said preceding one and said successive one of the word lines.

6. A semiconductor memory device comprising:

a memory array unit including memory cells arranged in matrix; and sense amplifiers arranged exteriorly of said memory array unit, wherein in said memory array unit a plurality of bit line pairs are selected by column addresses and a plurality of word lines are selected by row addresses, each of said plurality of word lines being divided into a plurality of divided word lines, said plurality of bit line pairs are respectively connected to said sense amplifiers, output signal of ones of said sense amplifiers corresponding to column address selection are transferred to respective data lines, said divided word lines ore sequentially activated on a time division basis in correspondence to row address selection such that an activation time period of a middle one of any three sequentially activated divided word lines partially overlaps with respective activation time periods of the preceding one and successive one of said any three sequentially activated divided word lines for a first predetermined period of time, wherein more than half of said activation period of said middle one of said word lines is non-overlapping with the activation periods of said preceding one and said successive one of the word line: and wherein more than half of said activation period of said middle one of said word lines is non-overlapping with the activation periods of said preceding one and said successive one of the word lines and wherein said plurality of sense amplifiers are sorted into a plurality of groups, sense amplifiers in each group have a common column address and transfer output signals to respective different data line pairs when said common column address is selected, and a plurality of data line pairs are connected to a parallel/serial converter circuit; and a semiconductor circuit including means for generating a first output signal and for detecting (i) a fall edge of an input signal to render said first output signal high level and (ii) a rise edge of said input signal to render said first output signal low level at expiration of a time delay equal to a second predetermined time period following detection of said rise edge; and means for generating a second output signal and for detecting (i) said rise edge of said input signal to render said second output signal high level and (ii) said fall edge of said input signal to render said second output signal low level at expiration of a time delay equal to a third predetermined time period following detection of said fall edge, said semiconductor circuit being used as a source for generating control signals comprising said first output signal and said second output signal, by means of which control signals said divided word lines are sequentially activated on said time division basis in correspondence to said row address selection such that an activation time period of a middle one of any three sequentially activated word lines overlaps with respective activation time periods of the preceding one and the successive one of said three sequentially activated divided word lines for a time equal to said first predetermined time period.

7. A semiconductor memory device comprising:

a first memory block including (a) a memory cell array comprising a plurality of columns and a plurality of rows of memory cells, (b) a sense amplifier and (c) a row decoder;

a second memory block including (a) a memory cell array comprising a plurality of columns and a plurality of rows of memory cells, (b) a sense amplifier and (c) a row decoder; and selection signal output means for outputting a first activation selection signal to enable selection and activation of said first memory block and a second activation selection signal to enable selection and activation of said second memory block, said first and second activation selection signals being output alternately such that an intermediate one of any three successive ones of said first and second activation selection signals has an activation period partially overlapping with respective activation periods of a preceding one and a subsequent one of said three successive ones of said first and second activation selection signals.

8. A device of claim 7, wherein each of the first and second activation selection signals outputted from said selection signal output means has an initial deactivation period prior to start of selection and activation of a selected one of said first and second memory blocks by said first and second activation selection signals respectively.

9. A device according to claim 7 wherein more than half of said activation period of said intermediate one of said first and second activation selection signals is non-overlapping with the activation periods of said preceding and subsequent ones of said first and second activation selection signals.

10. A semiconductor memory device comprising:

a plurality of memory blocks each including (a) a memory cell array comprising a plurality of columns and a plurality of rows of memory cells, (b) sense amplifier means and (c) a row decoder; and activation selection signal output means for outputting a plurality of activation selection signals which respectively enable selection and activation of respective individual ones of said plurality of memory blocks in a predetermined sequence such that an intermediate one of any three successive ones of said plurality of activation signals has an activation period partially overlapping with respective activation periods of a preceding one and a subsequent one of said three successive ones of said plurality of activation signals.

11. A device of claim 10, wherein said plurality of memory blocks are two memory blocks.

12. A device of claim 1, wherein said predetermined sequence includes selecting and activating said two memory blocks alternately.

13. A device of claim 10, wherein each of the plurality of activation selection signals outputted from said selection signal output means has a initial deactivation period prior to start of selection and activation of a selected one of said plurality of memory blocks by said plurality of activation selection signals respectively.

14. A device according to claim 10, wherein more than half of said activation period of said intermediate one of said plurality of activation signals is non-overlapping with the activation periods of said preceding and subsequent ones of said plurality of activation signals.

15. A semiconductor memory device comprising:

a plurality of memory blocks each including a memory cell array, sense amplifier means and a row decoder; and activation selection signal output means for outputting a plurality of activation selection signals to select and activate said plurality of memory blocks in a predetermined sequence such that an intermediate one of any three sequential activation signals has an activation period partially overlapping with respective activation periods of a preceding one and a subsequent one of said three sequential activation signals, wherein the respective row decoders of said plurality of memory blocks receive respective activation selection signals from said signal output means and activate word lines of the respective memory arrays in response to the received activation selection signals such that an intermediate one of any three successively activated word lines has an activation period partially overlapping with respective activation periods of a preceding one and a subsequent one of said three word lines.

16. A device of claim 15, wherein said plurality of memory blocks are two memory blocks.

17. A device of claim 16, wherein said predetermined sequence includes selecting and activating said two memory blocks alternately.

18. A device of claim 15, further including a parallel-serial conversion circuit for receiving output signal of the respective sense amplifier means provided in said plurality of memory blocks.

19. A device according to claim 15, wherein more than half of said activation period of said intermediate one of said word lines is non-overlapping with the activation periods of said preceding and subsequent word lines.

20. A semiconductor memory device comprising:

a plurality of memory blocks each including a memory cell array, sense amplifier means and a row decoder, wherein said row decoder activates word lines provided in the respective memory cell array such that an intermediate one of any three successive word lines has an activation period partially overlapping with respective activation periods of a preceding one and a subsequent one of said three word lines, wherein more than half of said activation period of said middle one of said word lines is non-overlapping with the activation periods of said preceding one and said successive one of the word lines.

21. A device of claim 20, wherein said plurality of memory blocks are two memory blocks.

22. A device according to claim 20, wherein more than half of said activation period of said intermediate one of said word lines is non-overlapping with the activation periods of said preceding and subsequent word lines.

23. A semiconductor memory device comprising:

a first memory block including a memory cell array, a sense amplifier and a row decoder;

a second memory block including a memory cell array, a sense amplifier and a row decoder; and selection signal output means for outputting a plurality of activation selection signals to select and activate said first and second memory blocks alternately such that an intermediate one of any three successive activation selection signals has an activation period partially overlapping with respective activation periods of a preceding one and a subsequent one of said three successive activation selection signals, wherein the respective row decoders of said first and second blocks receive respective activation selection signals from said signal output means and activate word lines of the respective memory arrays in response to the received activation selection signals such that an intermediate one of any three successively activated word lines has an activation period partially overlapping with respective activation periods of a preceding one and a subsequent one of said three word lines.

24. A device according to claim 23, wherein more than half of said activation period of said intermediate one of said word lines is non-overlapping with the activation periods of said preceding and subsequent word lines.

25. A semiconductor memory device comprising:

a first memory block including (a) a first memory cell array comprising a plurality of columns and a plurality of rows of memory cells, (b) a first sense amplifier and (c) a first row decoder;

a second memory block including (a) a second memory cell array comprising a plurality of columns and a plurality of rows of memory cells, (b) a second sense amplifier and (c) a second row decoder;

selection signal generation means for generating first and second selection signals to enable selection and activation of an optional one of said first and second memory blocks; and means for inputting data externally to said selection signal generation means to enable successive random accesses to said memory blocks, wherein said selection signal generation means outputs said first and second selection signals formed of data input by said inputting means, said first and second selection signals having respective activation periods to respectively enable selection and activation of respective individual ones of said first and second memory blocks alternately such that an intermediate one of any three successive ones of said first and second selection signals, that are output sequentially, has an activation period partially overlapping with respective activation periods of a preceding one and a subsequent one of said three successive ones of said first and second selection signals.

26. A device according to claim 25, wherein more than half of said activation period of said intermediate one of said first and second selection signals is non-overlapping with the activation periods of said preceding and subsequent ones of said first and second selection signals.

27. A semiconductor memory device comprising:

a plurality of memory blocks each including (a) a memory cell array comprising a plurality of columns and a plurality of rows of memory cells, (b) a sense amplifier and (c) a row decoder;

selection signal generation means for outputting a plurality of selection signals to respectively enable selection and activation of respective individual ones of at least three of said memory blocks sequentially; and means for inputting data externally to said signal generation means to enable successive random accesses to said memory blocks, wherein said selection signal generation means outputs the plurality of selection signals formed of data input by said inputting means, said plurality of selection signals having respective activation periods to enable selection and activation of said at least three of said memory blocks in a predetermined sequence such that an intermediate one of any three successive ones of said plurality of selection signals, that are generated sequentially, has an activation period partially overlapping with the respective activation periods of a preceding one and a subsequent one of said any three successive ones of said selection signals.

28. A device according to claim 27, wherein more than half of said activation period of said intermediate one of said plurality of selection signals is non-overlapping with the activation periods of said preceding and subsequent ones of said plurality of selection signals.

29. A semiconductor memory device comprising:

a plurality of memory blocks each including (a) a memory cell array comprising a plurality of columns and a plurality of rows of memory cells, (b) a sense amplifier and (c) a row decoder;

selection signal generation means for outputting a plurality of selection signals to respectively enable selection and activation of respective individual ones of at least three of said memory blocks sequentially; and means for inputting data externally to said signal generation means to enable successive random accesses to said memory blocks, wherein said selection signal generation means outputs the plurality of selection signals formed of data input by said inputting means, said plurality of selection signals having respective activation periods to enable selection and activation of said at least three of said memory blocks in a predetermined sequence such that an intermediate one of any three successive ones of said plurality of selection signals, that are generated sequentially, has an activation period partially overlapping with the respective activation periods of a preceding one and a subsequent one of said any three successive ones of said selection signals, wherein said row decoder of each of said plurality of memory blocks receives one of the selection signals output from the selection signal generation means to enable word lines of the respective memory cell array in response to the received selection signals, wherein an intermediate one of any three sequentially received ones of said plurality of selection signals has an activation period partially overlapping with the respective activation periods of a preceding one and a subsequent one of said any three received ones of said plurality of selection signals.

30. A semiconductor memory device comprising:

a first memory block including a plurality of first memory cells for storing data and selectively controllable by a first-memory block selection signal;

a second memory block including a plurality of second memory cells for storing data and selectively controllable by a second-memory block selection signal different from said first-memory block selection signal;

a circuit for producing said first and said second memory block selection signals, wherein each of said selection signals takes any optional one of an activation state and a deactivation state, having a first operation mode having a first period of time during which said first-memory block selection signal takes said activation state and said second-memory block selection signal takes said deactivation state, respectively, and having a second period of time just after said first period of time, during which second period said second-memory block selection signal changes from said deactivation state to said activation state before said first-memory block selection signal changes from said activation state to said deactivation state; and having a second operation mode having a third period of time during which said first-memory block selection signal takes said deactivation state and said second-memory block selection signal takes said activation state, respectively, and having a fourth period of time just after said third period of time, during which fourth period said first-memory block selection signal changes from said deactivation state to said activation state before said second-memory block selection signal changes from said activation state to said deactivation state.

31. A device according to claim 30 wherein said third period of time is subsequent to said second period of time.

32. A device according to claim 31, wherein said third period of time is longer than said second period of time and longer than said fourth period of time.

33. A device according to claim 30, wherein one of said first memory cells of said first memory block is accessed at row and column addresses externally addressed, in response to changing of said first-memory block selection signal from said deactivation state to said activation state and one of said second memory cells of said second memory block is accessed at row and column addresses externally addressed, in response to changing of said second-memory block selection signal having changed from said deactivation state to said activation state.

34. A device according to claim 30, wherein said circuit produces each of said first-memory block selection signal and said second-memory block selection in response to receiving an input signal.

35. A device according to claim 30, wherein said first memory block includes a plurality of first word lines and one of said plurality of first word lines is enabled in response to changing of said first-memory block selection signal from its deactivation state to its activation state said second memory block includes a plurality of second word lines and one of said plurality of second word lines is enabled in response to changing of said second-memory block selection signal from its deactivation state to its activation state.

36. A device according to claim 30, wherein said first-memory block includes a plurality of first word lines, and said second-memory block includes a plurality of second word lines, said device further comprising a conversion circuit for parallel-to-serial conversion of at least one of data groups, one of said data groups being output data of a group of said first memory cells connected to one of said first word lines, and another one of said data groups being output data of a group of said second memory cells connected to one of said second word lines.

37. A device according to claim 36, further including a conversion circuit for serial-to-parallel conversion of data input externally.

38. A device according to claim 30, further including a conversion circuit for serial-to-parallel conversion of data input externally.

39. A device according to claim 32, wherein said producing circuit produces at least two memory block selection signals comprising said first and said second memory block selection signals and said first memory block has associated therewith a first sense amplifier for amplifying read-out data from said first memory block, said first sense amplifier being enabled when said first memory block is activated in response to said activation state of the first memory block selection signal and said second memory block has associated therewith a second sense amplifier for amplifying read-out data from said second memory block, said second sense amplifier being enabled when said second memory block is activated in response to said activation state of said second memory block selection signal.

40. A device according to claim 30, wherein said first memory block selection signal takes said activation state during an activation period and said deactivation state during a deactivation period alternately, said activation period comprises a first activation period starting portion and a second activation period ending portion, and an intermediate one of any three sequentially produced activation periods has said first portion overlapping said second portion of the preceding one of said three activation periods and has said second portion overlapping said first portion of the succeeding one of said three activation periods.

41. A semiconductor memory device comprising:

a plurality of memory blocks each including a plurality of memory cells for storing data and selectively controllable by a respective one of a plurality of memory block selection signals; and a circuit for producing the memory block selection signals; wherein:

each of said selection signals takes any optional one of an activation state and a deactivation state, having a first operation mode having a first period of time during which one of said memory block selection signals takes said activation state and another one of said block selection signals takes said deactivation state, respectively, and having a second period of time just after said first period of time, during which second period said another one of said block selection signals changes from said deactivation state to said activation state before said one of said block selection signals changes from said activation state to said deactivation state and having a second operation mode having a third period of time during which one of said block selection signals takes said deactivation state and another one of said block selection signals takes said activation state, respectively, and having a fourth period of time just after said third period of time, during which fourth period said one of said block selection signals changes from said deactivation state to said activation state before said another one of said block selection signals changes from said activation state to said deactivation state.

42. A device according to claim 41, wherein said third period of time is subsequent to said second period of time.

43. A device according to claim 41, wherein said third period of time is longer than said second period of time and longer than said fourth period of time.

44. A device according to claim 41, wherein one of the memory cells of respective ones of said plurality of memory blocks is accessed at row and column addresses externally addressed, in response to corresponding respective ones of said memory block selection signals which have respectively changed from said deactivation state to said activation state.

45. A device according to claim 41, wherein said circuit produces each of said block selection signals by receiving an input signal.

46. A device according to claim 41, wherein each of said memory blocks includes a plurality of word lines and one of said word lines of respective ones of said memory blocks is enabled in response to corresponding respective ones of said memory block selection signals which have respectively changed from said deactivation state to said activation state.

47. A device according to claim 41, wherein each of said memory blocks includes a plurality of word lines, and said device further includes a conversion circuit for parallel-to-serial conversion of at least one of data groups, one of said data groups being output data of a group of memory cells connected to one of the word lines included in one of said memory blocks, and another one of said data groups being output data of a group of memory cells connected to one of the word lines included in another one of said memory blocks.

48. A device according to claim 47, further including a conversion circuit for serial-to-parallel conversion of data input externally.

49. A device according to claim 41, further including a conversion circuit for serial-to-parallel conversion of data input externally.

50. A device according to claim 41, wherein each of said memory blocks has associated therewith a sense amplifier for amplifying read-out data therefrom, said sense amplifier being enabled when its associated one of said memory blocks is activated in response to said activation state of the respective one of said memory block selection signals.

51. A device according to claim 41, wherein each of said memory block selection signals takes said activation state during an activation period and said deactivation state during a deactivation period alternately, said activation period comprises a first activation period starting portion and a second activation period ending portion, and an intermediate one of any three sequentially produced activation periods has said first portion overlapping said second portion of the preceding one of said three activation periods and has said second portion overlapping said first portion of the succeeding one of said three activation periods.

52. A semiconductor memory device comprising:
a first memory block including a plurality of first memory cells for storing data and a plurality of first word lines connected to at least one of said first memory cells, said first memory block being selectively controllable by a first memory block selection signal;
a second memory block including a plurality of second memory cells for storing data and a plurality of second word lines connected to at least one of said second memory cells, said second memory block being selectively controllable by a second-memory block selection signal different from said first-memory block selection signal;
a circuit for producing said first and said second memory block selection signals, wherein each of said first word block lines can take any optional one of an activation state and a deactivation state in response to said first block selection signal, and each of said second word lines can take any optional one of an activation state and a deactivation state in response to said second block selection signal, having a first operation mode having a first period of time during which one of said first word lines takes said activation state and one of said second word lines takes said deactivation state, respectively, and having a second period of time just after said first period of time during which said one of said second word lines changes from said deactivation state to said activation state before said one of said first word lines changes from said activation state to said deactivation state; and having a second operation mode having a third period of time during which one of said first word lines takes said deactivation state and one of said second word lines takes said activation state, respectively, and having a fourth period of time just after said third period of time, during which fourth period said one first word line changes from said deactivation state to said activation state before said one second word line changes from said activation state to said deactivation state.

53. A semiconductor memory device comprising:
a plurality of memory blocks each including a plurality of memory cells for storing data and a plurality of word lines connected to at least one of said memory cells, said first memory blocks being selectively controllable by respective memory block selection signals;
a circuit for producing the memory block selection signals, wherein each of said word lines can take any optional one of an activation state and a deactivation state in response to a corresponding one of said block selection signals, having a first operation mode having a first operation period of time during which one of said first word lines takes said activation state, said one word line being included in one of said memory blocks, and another one of said word lines takes said deactivation state, said another one word line being included in another one of said memory blocks, and having a second operation period of time just after said first period of time, during which second period said another one of said word lines changes from said dactivation state to said activation sate before said one of said word lines changes from said activation state to said deactivation state; and having a second operation mode having a third operation period of time during which one of said word lines takes said deactivation state, said one word line being included in other one of said memory blocks, and another one of said word lines takes said activation state, said another one word line being included in still another one of said memory blocks, and having a fourth operation period of time just after said third operation period of time, during which fourth operation period said one word line of said other memory block changes from said deactivation state to said activation state before said another word line changes from said activation state to said deactivation state.

54. A device according to claim 53, wherein each of said memory blocks has associated therewith a sense amplifier for amplifying read-out data therefrom, said sense amplifier being enabled when its associated one of said memory blocks is activated in response to said activation state of the respective one of said memory block selection signals.

55. A device according to claim 53, said activation period comprises a first activation period starting portion and a second activation period ending portion, and an intermediate one of any three sequentially produced activation periods has said first portion overlapping said second portion of the preceding one of said three activation periods and has said

17 second portion overlapping said first portion of the succeeding one of said three activation periods.

56. A system comprising a semiconductor memory device and a circuit for producing a first memory block selection signal and a second memo said first-memory block different from said first-memory block selection signal, said semiconductor memory device including:

a first memory block comprising a plurality of first memory cells for storing data and selectively controllable by the first-memory block selection signal;

a second memory block comprising a plurality of second memory cells for storing data and selectively controllable by the second-memory block selection signal;

wherein each of said first and said second memory block selection signals takes any optional one of an activation state and a deactivation state, having a first operation mode having a first operation period of time dining which said first-memory block selection signal takes said activation state and said second-memory block selection signal takes said deactivation state, respectively, and having a second operation period of time just after said first operation period of time, during which second operation period said second-memory block selection signal changes from said deactivation state to said activation state before said first-memory block selection signal changes from said activation state to said deactivation state; and having a second operation mode having a third operation period of time during which said first-memory block selection signal takes said deactivation state and said second-memory block selection signal takes said activation state, respectively, and having a fourth operation period of time just after said third operation period of time, during which fourth operation period said first-memory block selection signal changes from said deactivation state to said activation state before said second-memory block selection signal changes from said activation state to said deactivation state.

57. A system including a semiconductor memory device and a circuit for producing a plurality of memory block selection signals, said semiconductor memory device comprising;

a plurality of memory blocks each including a plurality of memory cells for storing data and selectively controllable by the memory block selection signals respectively, wherein each of said selection signals takes any optional one of an activation state and a deactivation state, having a first operation mode having a first operation period of time during which one of said memory block selection signals takes said activation state and another one of said memory block selection signals takes said reactivation state, respectively, and having a second operation period of time just after said first operation period of time, during which second operation period said another one of said memory block selection signals changes from said deactivation state to said activation state before said one of said memory block selection signals changes from said activation state to said deactivation state; and having a second operation mode having a third operation period of time during which one of said memory block selection signals takes said deactivation state and another one of said memory block selection signals takes said activation state, respectively, and having a fourth operation period of time just after said third operation period of time, during which fourth operation period said one of said memory block selection signals changes from said deactivation state to said activation state before said another one of said memory block selection signals changes from said activation state to said deactivation state.

58. A device according to claim 57, wherein each of said memory blocks has associated therewith a sense amplifier for amplifying read-out data therefrom, said sense amplifier being enabled when its associated one of said memory blocks is activated in response to said activation state of the respective one of said memory block selection signals.

59. A device according to claim 57, said activation period comprises a first activation period starting portion and a second activation period ending portion, and an intermediate one of any three sequentially produced activation periods has said first portion overlapping said second portion of the preceding one of said three activation periods and has said second portion overlapping said first portion of the succeeding one of said three activation periods.

60. A system including a semiconductor memory device and a circuit for producing a first memory-block selection signal and a second memory-block selection signal different from said first memory-block selection signal, said semiconductor memory device including:

a first memory block comprising a plurality of first memory cells for storing data and a plurality of first word lines connected to at least one of said first memory cells, said first memory block being selectively controllable by said first memory-block selection signal; and a second memory block comprising a plurality of second memory cells for storing data and a plurality of second word lines connected to at least one of said second memory cells, said second memory block being selectively controllable by said second memory-block selection signal different from said first memory-block selection signal; wherein:

each of said first word lines can take any optional one of an activation state and a deactivation state in response to said first block selection signal, and each of said second word lines can take any optional one of an activation state and a deactivation state in response to said second block selection signal, having a first operation mode having a first operation period of time during which one of said first word lines takes said activation state and one of said second word lines takes said deactivation state, respectively, and having a second operation period of time just after said first operation period of time during which second operation period said one of said second word lines changes from said deactivation state to said activation state before said one of said first word lines changes from said activation state to said deactivation state; and having a second operation mode having a third operation period of time during which one of said first word lines takes said deactivation state and one of said second word lines takes said activation state, respectively, and having a fourth operation period of time just after said third operation period of time, during which fourth operation period said one of said first word lines changes from said deactivation state to said activation state before said one of said second word lines changes from said activation state to said deactivation state.

61. A system including a semiconductor device and a circuit for producing a plurality of memory block selection signals, said semiconductor device including a plurality of memory blocks each including a plurality of memory cells for storing data and a plurality of word lines connected to at lest one of said memory cells, said memory blocks being selectively controllable by the respective memory block selection signals, wherein each of said word lines can take any optional one of an activation state and a deactivation state in response to a corresponding one of said block selection signals, having a first operation mode having a first operation period of time during which one of said first word lines takes said activation state, said one word line being included in one of said memory blocks, and another one of said word lines takes said deactivation state, said another one word line being included in another one of said memory blocks, and having a second operation period of time just after said first period of time, during which second period said another one of said word lines changes from said deactivation state to said activation state before said one of said word lines changes from said activation state to said deactivation state; and having a second operation mode having a third operation period of time during which one of said word lines takes said deactivation state, said one word line being included in other one of said memory blocks, and other one of said word lines takes said activation state, said other one word line being included in still another one of said memory blocks, and having a fourth operation period of time just after said third operation period of time, during which fourth operation period said one word line of said other memory block changes from said deactivation state to said activation state before said other one word line changes from said activation state to said deactivation state.

62. A device according to claim 61, wherein each of said memory blocks has associated therewith a sense amplifier for amplifying read-out data therefrom, said sense amplifier being enabled when its associated one of said memory blocks is activated in response to said activation state of the respective one of said memory block selection signals.

63. A device according to claim 61, said activation period comprises a first activation period starting portion and a second activation period ending portion, and an intermediate one of any three sequentially produced activation periods has said first portion overlapping said second portion of the preceding one of said three activation periods and has said second portion overlapping said first portion of the succeeding one of said three activation periods.

* * * * *

UNITED STATES PATENT AND TRADEMARK OFFICE
CERTIFICATE OF CORRECTION

PATENT NO. : 5,699,300

DATED : December 16, 1997

INVENTOR(S) : Hironori AKAMATSU, et al.

It is certified that error appears in the above-identified patent and that said Letters Patent is hereby corrected as shown below: On the title page:

Line [73], insert --Matsushita Electric Industrial Co., Ltd., Osaka, Japan--.

Signed and Sealed this

Fourteenth Day of July, 1998

*Attest:*

BRUCE LEHMAN

*Attesting Officer*     *Commissioner of Patents and Trademarks*